(12) United States Patent
Lin

(10) Patent No.: US 11,456,303 B2
(45) Date of Patent: Sep. 27, 2022

(54) FUSE ARRAY STRUCTURE

(71) Applicant: NANYA TECHNOLOGY CORPORATION, New Taipei (TW)

(72) Inventor: Shian-Jyh Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 237 days.

(21) Appl. No.: 16/667,104

(22) Filed: Oct. 29, 2019

(65) Prior Publication Data
US 2020/0212049 A1    Jul. 2, 2020

Related U.S. Application Data

(60) Provisional application No. 62/785,359, filed on Dec. 27, 2018.

(51) Int. Cl.
*H01L 27/115* (2017.01)
*H01L 27/108* (2006.01)

(52) U.S. Cl.
CPC .. *H01L 27/10897* (2013.01); *H01L 27/10823* (2013.01)

(58) Field of Classification Search
CPC ......... H01L 27/10897; H01L 27/10823; H01L 23/5252; H01L 27/11206
See application file for complete search history.

(56) References Cited

U.S. PATENT DOCUMENTS

| | | | |
|---|---|---|---|
| 2005/0237777 A1* | 10/2005 | Hsieh | H01L 27/11568 257/E21.679 |
| 2007/0117299 A1 | 5/2007 | Abedifard | |
| 2012/0025323 A1* | 2/2012 | Teo | H01L 29/401 257/E27.06 |
| 2015/0055413 A1 | 2/2015 | Alsmeier | |
| 2015/0102395 A1* | 4/2015 | Park | H01L 27/10823 257/301 |

FOREIGN PATENT DOCUMENTS

| | | |
|---|---|---|
| TW | 201320307 A1 | 5/2013 |
| TW | 201608615 A | 3/2016 |

* cited by examiner

*Primary Examiner* — Khaja Ahmad
*Assistant Examiner* — Pavel G Ivanov
(74) *Attorney, Agent, or Firm* — Muncy, Geissler, Olds & Lowe, P.C.

(57) ABSTRACT

A semiconductor structure includes a substrate including a substrate including a first surface, a first doped region disposed under the first surface, a second doped region disposed under the first surface, and a recess indented into the substrate and disposed between the first doped region and the second doped region; a control gate structure disposed over the first doped region and electrically connected to a control bit line; a fuse gate structure disposed over the second doped region and electrically connected to a fuse bit line; and a buried word to line disposed between the control gate structure and the fuse gate structure, wherein the buried word line is disposed within the recess of the substrate.

14 Claims, 6 Drawing Sheets

FUSE ARRAY STRUCTURE

PRIORITY CLAIM AND CROSS-REFERENCE

This application claims the priority benefit of U.S. provisional application Ser. No. 62/785,359 filed on Dec. 27, 2018. The entirety of the above-mentioned patent application is hereby incorporated by reference herein and made a part of this specification.

TECHNICAL FIELD

The present disclosure relates to a semiconductor structure, and particularly relates to a fuse array structure having a buried word line disposed within a substrate.

DISCUSSION OF THE BACKGROUND

Semiconductor devices are essential for many modern applications. Among the semiconductor devices, memory devices such as dynamic random access memory (DRAM) have assumed an important role. The memory device includes several memory cells arranged in rows and columns over a substrate, and information of each memory cell is accessible by bit lines and word lines extending over a surface of the substrate.

With the advancement of electronic technology, capacity of a fuse array structure continues to increase. In other words, a density of the fuse array structure arranged over the substrate is increased. Accordingly, it is difficult to maintain sufficient isolation between electrical components in the fuse array structure.

Therefore, there is a continuous need to improve a structural configuration of the semiconductor device.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure comprising a substrate including a first surface, a first doped region disposed under the first surface, a second doped region disposed under the first surface, and a recess indented into the substrate and disposed between the first doped region and the second doped region; a control gate structure disposed over the first doped region and electrically connected to a control bit line; a fuse gate structure disposed over the second doped region and electrically connected to a fuse bit line; and a buried word line disposed between the control gate structure and the fuse gate structure, wherein the buried word line is disposed within the recess of the substrate.

In some embodiments, the buried word line is disposed under and away from the first surface of the substrate.

In some embodiments, the buried word line is disposed under and away from the first doped region and the second doped region.

In some embodiments, the recess extends from the first surface of the substrate towards a second surface of the substrate opposite to the first surface.

In some embodiments, the fuse gate structure includes a fuse dielectric disposed on the second doped region.

In some embodiments, the fuse dielectric is breakable when a voltage bias between the buried word line and the fuse bit line is substantially greater than 5V.

In some embodiments, the buried word line is disposed under and away from the fuse dielectric.

In some embodiments, the fuse dielectric includes oxide or metal contained oxide.

In some embodiments, the first doped region and the second doped region are of a same conductive type.

In some embodiments, the buried word line includes a conductor and a dielectric layer disposed within the recess and between the substrate and the conductor.

In some embodiments, the dielectric layer is disposed conformal to a sidewall of the recess.

In some embodiments, the dielectric layer includes a first portion disposed between the conductor and the substrate, and a second portion disposed under the conductor, and wherein a thickness of the first portion is substantially greater than a thickness of the second portion.

In some embodiments, the dielectric layer includes high-k (high dielectric constant) dielectric material.

In some embodiments, the control bit line and the fuse bit line are substantially orthogonal to the buried word line.

In some embodiments, the control bit line and the fuse bit line are substantially parallel to each other.

Another aspect of the present disclosure provides a semiconductor structure comprising a substrate including a first surface, a first doped region disposed under the first surface, a second doped region disposed under the first surface, a first recess indented into the substrate and disposed between the first doped region and the second doped region, and a second recess indented into the substrate and adjacent to the second doped region; a first gate structure disposed over the first doped region and electrically connected to a first bit line; a second gate structure disposed over the first surface of the substrate and electrically connected to a second bit line; and a buried word line disposed within the first recess and disposed between the first gate structure and the second gate structure, wherein the second gate structure is at least partially disposed within the second recess of the substrate.

In some embodiments, a depth of the second recess is substantially less than a depth of the first recess.

In some embodiments, the second gate structure includes a gate dielectric disposed within the second recess of the substrate.

In some embodiments, the gate dielectric is breakable upon a voltage bias between the buried word line and the second bit line.

In some embodiments, the voltage bias between the buried word line and the second bit line is substantially greater than 2V.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
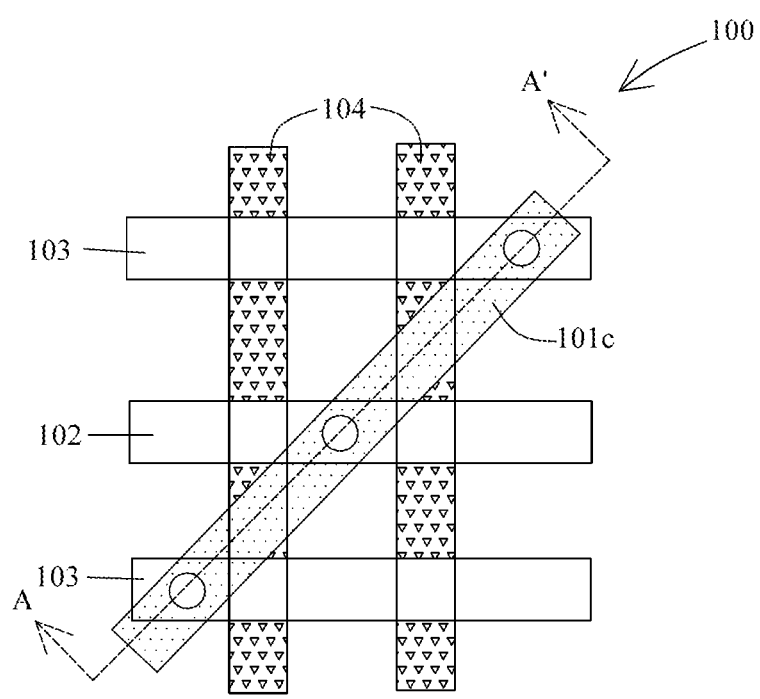
FIG. 1 is a schematic top view of a first semiconductor structure in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

As used herein, the term "anti-fuse" refers to a semiconductor device which is a normally open circuit. The anti-fuse can be "blown" to become a short circuit when a programming voltage is applied. In some embodiments of the present disclosure, the anti-fuse structure includes a gate oxide (GOX) anti-fuse structure.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

In a fuse array structure, an antifuse dielectric such as a very thin oxide barrier layer is employed between a pair of conductors. Formation of a conductive channel between the conductors across the antifuse dielectric is performed by a dielectric breakdown of the antifuse dielectric. The antifuse dielectric can be broken down by applying a high voltage pulse across the antifuse dielectric.

With the technological advancement, functionality and capacity of the fuse array structure is increased. However, an overall size of the fuse array structure continues to become smaller and smaller. As such, an isolation distance between the antifuse dielectric and the word line or the bit line may not be sufficient for such a high voltage pulse of the dielectric breakdown. As a result, reliability of the fuse array structure is adversely affected.

In the present disclosure, a semiconductor structure is disclosed. The semiconductor structure includes a substrate including a first surface, a first doped region disposed under the first surface, a second doped region disposed under the first surface, and a recess indented into the substrate and disposed between the first doped region and the second doped region; a control gate structure disposed over the first doped region and electrically connected to a control bit line; a fuse gate structure disposed over the second doped region and electrically connected to a fuse bit line; and a buried word line disposed between the control gate structure and the fuse gate structure, wherein the buried word line is disposed within the recess of the substrate. Since the buried word line is buried in the substrate, a distance between the buried word line and the fuse gate structure can be maximized. Therefore, electrical isolation between the buried word line and the fuse gate structure is improved.

Figure 2:
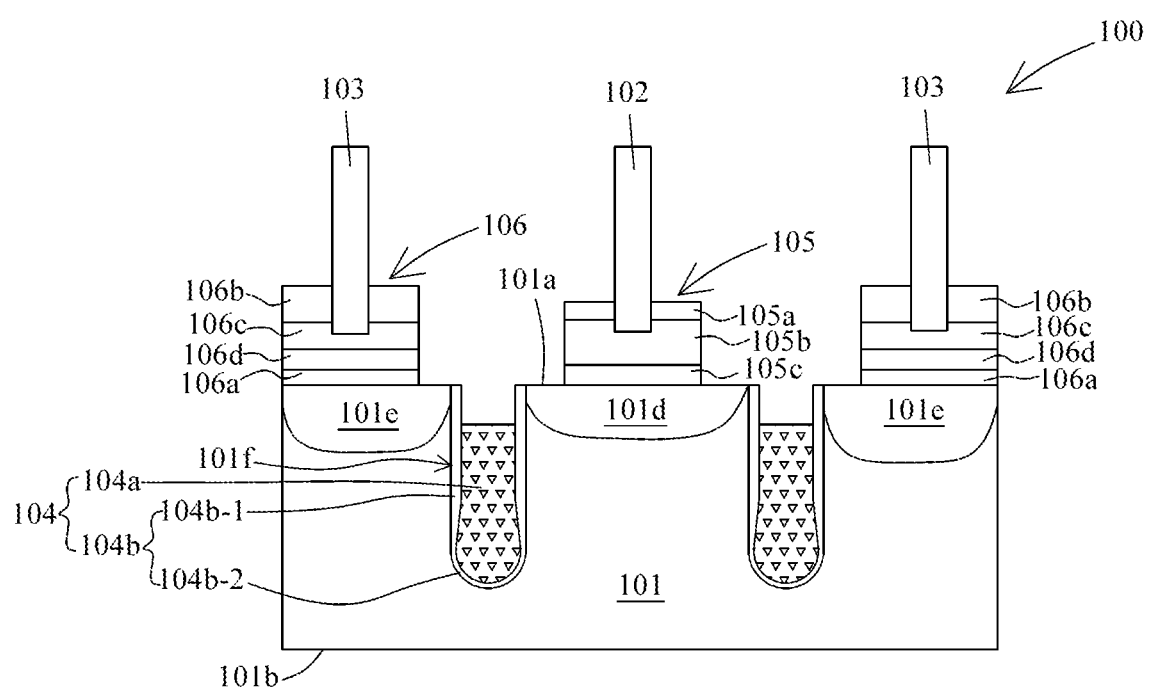
FIG. 2 is a schematic cross-sectional view of the first semiconductor structure along a line A-A' of FIG. 1 in accordance with some embodiments of the present disclosure.

FIG. 1 is a schematic top view of a first semiconductor structure 100 in accordance with some embodiments of the present disclosure. FIG. 2 is a schematic cross-sectional view of the first semiconductor structure 100 along a line A-A' of FIG. 1.

In some embodiments, the first semiconductor structure 100 is formed adjacent to a memory device such as a dynamic random access memory (DRAM) device or the like. In some embodiments, the first semiconductor structure 100 is a fuse array structure or a part of the fuse array structure.

In some embodiments, the first semiconductor structure 100 includes several conductive lines extending over a substrate 101. In some embodiments, the conductive lines are arranged in rows and columns. In some embodiments, the conductive lines include several bit lines (102, 103) and several word lines 104. In some embodiments, the bit lines (102, 103) are substantially orthogonal to the word lines 104. In some embodiments, the bit lines (102, 103) are electrically isolated from each other. In some embodiments, the word lines 104 are electrically isolated from each other.

In some embodiments, the bit lines include a control bit line 102 and a fuse bit line 103. In some embodiments, information or data can be stored in the memory through the bit line when the gate is opened by the word line. In some embodiments, the control bit line 102 and the fuse bit line 103 are substantially parallel to each other.

In some embodiments, the first semiconductor structure 100 includes the substrate 101. In some embodiments, the substrate 101 is a semiconductive substrate. In some embodiments, the substrate 101 includes semiconductive material such as silicon, germanium, gallium, arsenic, or combinations thereof. In some embodiments, the substrate 101 is a silicon substrate. In some embodiments, the substrate 101 includes material such as ceramic, glass or the like. In some embodiments, the substrate 101 is a silicon on insulator (SOI) substrate, wherein an insulation layer is disposed over a silicon substrate. In some embodiments, the substrate 101 is fabricated with a predetermined functional circuit thereon.

In some embodiments, the substrate 101 includes a first surface 101a and a second surface 101b opposite to the first surface 101a. In some embodiments, an active region 101c (shown in FIG. 1) is disposed over or in the substrate 101. In some embodiments, the active region 101c is disposed over or proximal to the first surface 101a of the substrate 101. In some embodiments, the active region 101c is disposed diagonally over the first surface 101a of the substrate 101.

In some embodiments, the active region 101c includes several doped regions (101d, 101e) (shown in FIG. 2). In some embodiments, each of the doped regions (101d, 101e) includes the same type of dopants. In some embodiments, each of the doped regions (101d, 101e) includes a type of dopant that is different from the type of dopant included in the other doped region (101d, 101e). In some embodiments, the doped regions (101d, 101e) include a first doped region 101d and a second doped region 101e. In some embodiments, the first doped region 101d and the second doped region 101e are disposed over or under the first surface 101a of the substrate 101. In some embodiments, the first doped region 101d and the second doped region 101e include dopants of the same type. In some embodiments, the first doped region 101d and the second doped region 101e include N type dopants. In some embodiments, the first doped region 101d and the second doped region 101e are of the same conductive type.

In some embodiments, the substrate 101 includes a recess 101f indented into the substrate 101 and disposed between the first doped region 101d and the second doped region 101e. In some embodiments, the recess 101f is indented into the substrate 101 from the first surface 101a towards the second surface 101b of the substrate 101. In some embodiments, the recess 101f is disposed under the active region 101c of the substrate 101. In some embodiments, the recess 101f is disposed under the first doped region 101d and the second doped region 101e.

In some embodiments, the first semiconductor structure 100 includes a control gate structure 105 disposed over the first doped region 101d and electrically connected to the control bit line 102. In some embodiments, the control gate structure 105 includes a masking layer 105a, a metallic layer 105b and a polysilicon layer 105c. In some embodiments, the metallic layer 105b is disposed over the polysilicon layer 105c, and the masking layer 105a is disposed over the metallic layer 105b. In some embodiments, the masking layer 105a includes silicon nitride, nitride or the like. In some embodiments, metallic layer 105b includes tungsten, titanium element or the like.

In some embodiments, the first semiconductor structure 100 includes a fuse gate structure 106 disposed over the second doped region 101e and electrically connected to the fuse bit line 103. In some embodiments, the fuse gate structure 106 includes a fuse dielectric 106a, a masking layer 106b, a metallic layer 106c and a polysilicon layer 106d. In some embodiments, the fuse dielectric 106a is under the masking layer 106b, the metallic layer 106c and the polysilicon layer 106d. In some embodiments, the masking layer 106b includes silicon nitride, nitride or the like. In some embodiments, metallic layer 106c includes tungsten, titanium element or the like. In some embodiments, the fuse dielectric 106a includes oxide, or metal contained oxide or the like.

In some embodiments, the first semiconductor structure 100 includes a buried word line 104 disposed within the substrate 101. In some embodiments, the buried word line 104 is disposed between the control gate structure 105 and the fuse gate structure 106. In some embodiments, the buried word line 104 is disposed within the recess 101f of the substrate 101. In some embodiments, the buried word line 104 is disposed under and away from the first surface 101a of the substrate 101. In some embodiments, the buried word line 104 extends between the first surface 101a and the second surface 101b of the substrate 101. In some embodiments, the buried word line 104 is disposed under and away from the first doped region 101d and the second doped region 101e.

In some embodiments, the buried word line 104 is configured to control a dielectric breakdown of the fuse dielectric 106a. In some embodiments, the buried word line 104 includes a conductor 104a within the recess 101E In some embodiments, the conductor 104a includes tungsten, titanium nitride, tungsten nitride, tantalum nitride, and the combination there of, etc.

In some embodiments, the buried word line 104 is surrounded by a dielectric layer 104b. In some embodiments, the dielectric layer 104b is disposed within the recess 101f of the substrate 101 and between the substrate 101 and the conductor 104a. In some embodiments, the dielectric layer 104b includes a first portion 104b-1 and a second portion 104b-2. In some embodiments, the first portion 104b-1 is disposed between the conductor 104a and the substrate 101. In some embodiments, the second portion 104b-2 is disposed under the conductor 104a. In some embodiments, the second portion 104b-2 surrounds an end portion of the conductor 104a. In some embodiments, a thickness of the first portion 104b-1 is substantially greater than a thickness of the second portion 104b-2. In some embodiments, the dielectric layer 104b includes high-k (high dielectric constant) dielectric material such as hafnium oxide ($HfO_2$).

In some embodiments, a conductive path across the fuse dielectric 106a and the dielectric layer 104b is absent if no breakdown voltage is applied between the buried word line 104 and the first fuse gate structure 106. In other words, a conductive path across the fuse dielectric 106a and the dielectric layer 104b is formed when the breakdown voltage is applied between the buried word line 104 and the first fuse gate structure 106. In some embodiments, the fuse dielectric 106a and the dielectric layer 104b undergo a dielectric breakdown process when the breakdown voltage is applied between the buried word line 104 and the first fuse gate structure 106. In some embodiments, the fuse dielectric 106a and the dielectric layer 104b are breakable when a voltage bias between the buried word line 104 and the fuse bit line 103 is substantially greater than 5V. In some embodiments, the fuse dielectric 106a and the dielectric layer 104b are breakable upon the dielectric breakdown process.

Figure 3:
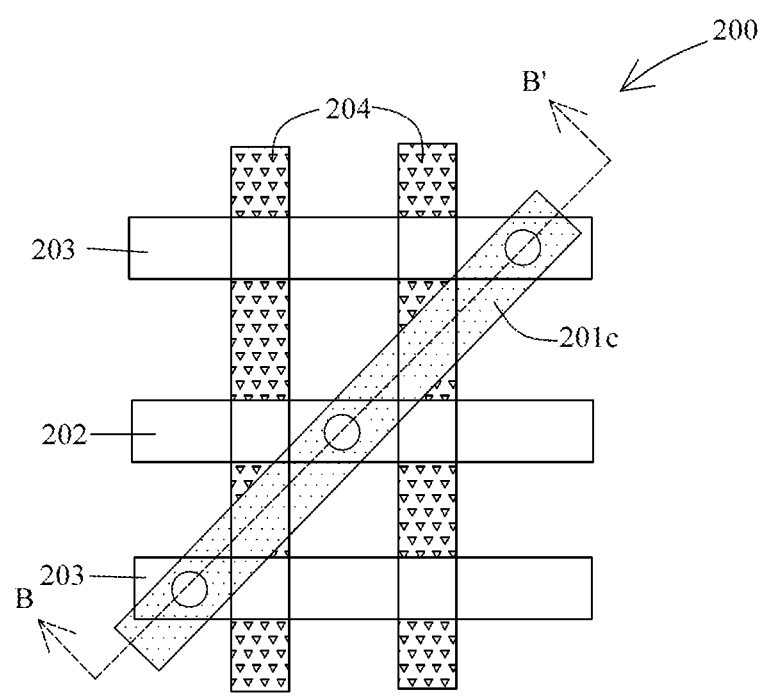
FIG. 3 is a schematic top view of a second semiconductor structure in accordance with some embodiments of the present disclosure.
Figure 4:
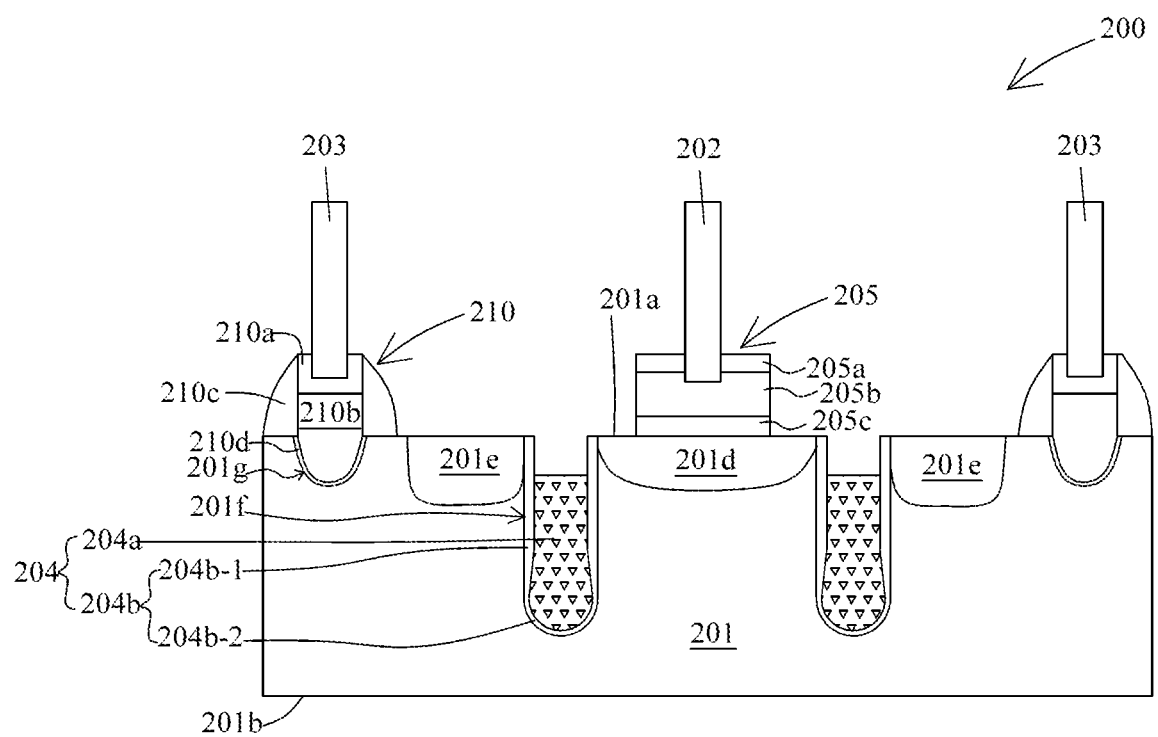
FIG. 4 is a schematic cross-sectional view of the second semiconductor structure along a line B-B' of FIG. 3 in accordance with some embodiments of the present disclosure.

FIG. 3 is a schematic top view of a second semiconductor structure 200 in accordance with some embodiments of the present disclosure. FIG. 4 is a schematic cross-sectional view of the second semiconductor structure 200 along a line B-B' of FIG. 3. In some embodiments, the second semiconductor structure 200 includes a substrate 201, which is in a configuration similar to the substrate 201 described above or illustrated in FIG. 2.

In some embodiments, the substrate 201 includes a first surface 201a (shown in FIG. 4), a second surface 201b opposite to the first surface 201. In some embodiments, an active region 201c (shown in FIG. 3) is disposed over or in the substrate 201. In some embodiments, the active region 201c includes a first doped region 201d and a second doped region 201e, which are in configurations similar to those described above or illustrated in FIG. 2. In some embodiments, the substrate 201 includes a first recess 201f and a buried word line 204 within the first recess 201f, which are in configurations similar to those described above or illustrated in FIG. 2.

In some embodiments, the substrate 201 includes a second recess 201g indented into the substrate 201 and adjacent to the second doped region 201e. In some embodiments, the second recess 201g extends from the first surface 201a towards the second surface 201b of the substrate 201. In some embodiments, the first recess 201f and the second recess 201g are formed separately or simultaneously. In some embodiments, a depth of the second recess 201g is substantially less than a depth of the first recess 201f.

In some embodiments, the second semiconductor structure 200 includes a control gate structure 205 disposed over the first doped region 201d and electrically connected to a control bit line 202. In some embodiments, the control gate structure 205 and the control bit line 202 are in configurations similar to those described above or illustrated in FIG. 2.

In some embodiments, the second semiconductor structure 200 includes a fuse gate structure 210 disposed over the first surface 210a of the substrate 201 and electrically connected to a fuse bit line 203. In some embodiments, the fuse gate structure 210 includes a masking layer 210a, a metallic layer 210b under the masking layer 210a, and a spacer 210c adjacent to or surrounding the masking layer 210a and the metallic layer 210b.

In some embodiments, the masking layer 210a includes silicon nitride, nitride or the like. In some embodiments, the metallic layer 210b includes polycrystalline silicon, titanium nitride, tungsten, or the like. In some embodiments, the second fuse gate structure 210 is electrically connected to the fuse bit line 203 through a contact above the masking layer 210a. In some embodiments, the fuse dielectric 210d includes oxide, silicon dioxide, etc. In some embodiments, the spacer 210c includes nitride, silicon nitride, oxide, etc.

In some embodiments, the metallic layer 210b is at least partially disposed within the second recess 210g of the substrate 201. In some embodiments, the metallic layer 210b is disposed on the fuse dielectric 210d. In some embodiments, at least a portion of the metallic layer 210b is disposed under the first surface 201a of the substrate 201. In some embodiments, the fuse dielectric 210d is disposed within the second recess 210g. In some embodiments, the fuse dielectric 210d is disposed between the metallic layer 210b and the substrate 201. In some embodiments, the fuse dielectric 210d is conformal to a sidewall of the second recess 201g.

In some embodiments, the buried word line 204 is disposed under and away from the fuse dielectric 210d. In some embodiments, a conductive path across the fuse dielectric 210d is absent if no breakdown voltage is applied between the second fuse gate structure 210 and the buried word line 204. In other words, a conductive path across the fuse dielectric 210d is formed when a breakdown voltage is applied between the second fuse gate structure 210 and the buried word line 204.

In some embodiments, the fuse dielectric 210d undergoes a dielectric breakdown process when the voltage is applied between the second fuse gate structure 210 and the buried word line 204. In some embodiments, the fuse dielectric 210d is breakable when a voltage bias between the buried word line 204 and the fuse bit line 203 is substantially greater than 2V. In some embodiments, the voltage bias is about 2V to about 4V. In some embodiments, the voltage bias is about 5V to about 10V. In some embodiments, the fuse dielectric 210d is damaged upon the dielectric breakdown process.

Figure 5:
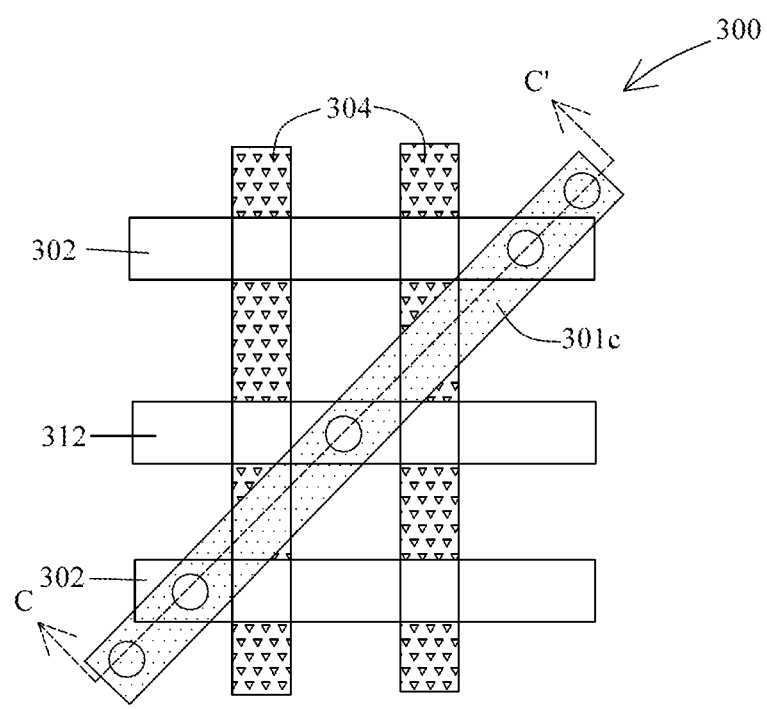
FIG. 5 is a schematic top view of a third semiconductor structure in accordance with some embodiments of the present disclosure.
Figure 6:
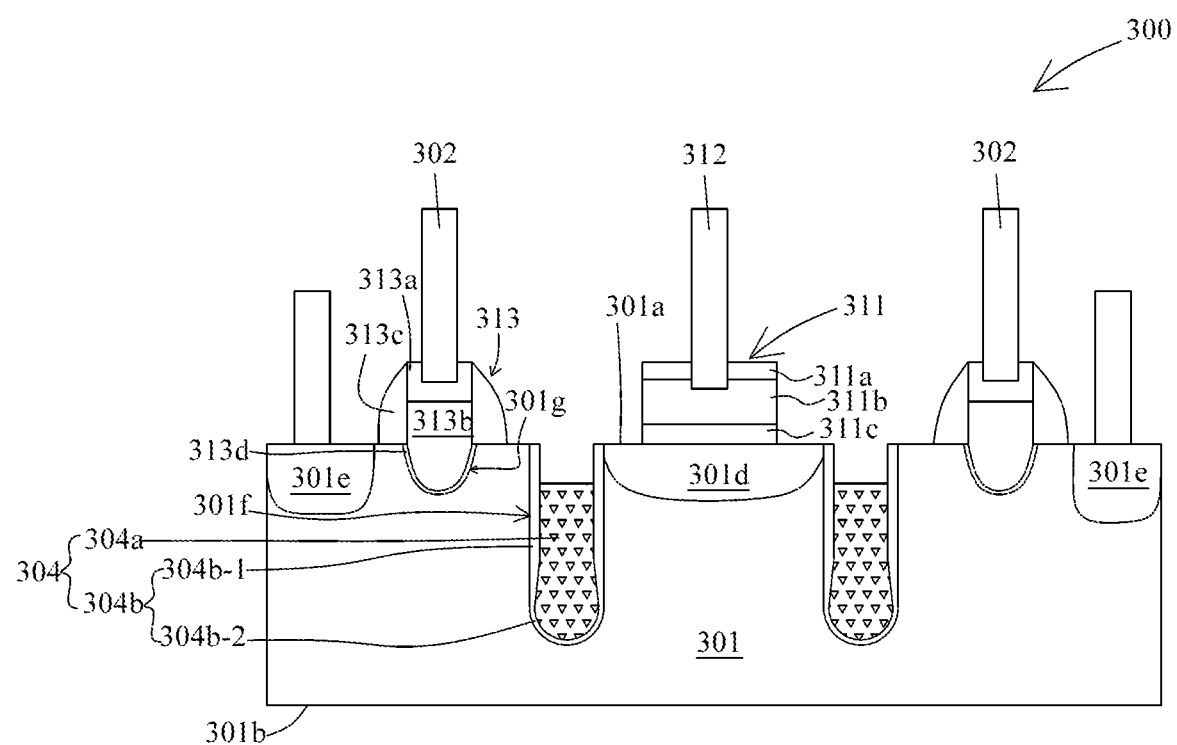
FIG. 6 is a schematic cross-sectional view of the third semiconductor structure along a line C-C' of FIG. 5 in accordance with some embodiments of the present disclosure.

FIG. 5 is a schematic top view of a third semiconductor structure 300 in accordance with some embodiments of the present disclosure. FIG. 6 is a schematic cross-sectional view of the third semiconductor structure 300 along a line C-C' of FIG. 5. In some embodiments, the third semiconductor structure 300 includes a substrate 301, which is in a configuration similar to the substrate 101, 201 described above or illustrated in FIG. 2 or FIG. 4.

In some embodiments, the substrate 301 includes a first surface 301a, a second surface 301b opposite to the first surface 301. In some embodiments, an active region 301c (shown in FIG. 5) is disposed over or in the substrate 301. In some embodiments, the active region 301c includes a first doped region 301d, a second doped region 301e, a first recess 301f and a second recess 301g, which are in configurations similar to those described above or illustrated in FIG. 4.

In some embodiments, the third semiconductor structure 300 includes a gate structure 311 disposed over the first doped region 301d and electrically connected to an electrical ground. In some embodiments, the gate structure 311 is electrically connected to a grounded bit line 312. In some embodiments, the gate structure 311 includes a masking layer 311a, a metallic layer 311b and a polysilicon layer 311c. In some embodiments, the masking layer 311a is disposed over the metallic layer 311b, and the metallic layer 311b is disposed over the polysilicon layer 311c. In some embodiments, the masking layer 311a includes silicon nitride, nitride or the like. In some embodiments, the metallic layer 311b includes tungsten, titanium or the like.

In some embodiments, the third semiconductor structure 300 includes a fuse gate structure 313 disposed over the first surface 301a of the substrate 301 and electrically connected to a control bit line 302. In some embodiments, the fuse gate structure 313 includes a masking layer 313a, a metallic layer 313b under the masking layer 313a, and a spacer 313c surrounding the masking layer 313a and the metallic layer 313b, which are in configurations similar to the fuse gate structure 210 described above or illustrated in FIG. 4.

In some embodiments, the metallic layer 313b is at least partially disposed within the second recess 301g. In some embodiments, the third semiconductor structure 300 includes a fuse dielectric 313d disposed within the second recess 301g of the substrate 301. In some embodiments, the fuse dielectric 313d is disposed under the first surface 301a of the substrate 301. In some embodiments, the fuse dielectric 313d is in a configuration similar to the fuse dielectric 210d described above or illustrated in FIG. 4.

In some embodiments, the third semiconductor structure 300 includes a buried word line 304 disposed between the gate structure 311 and the fuse gate structure 313. In some embodiments, the buried word line 304 is disposed within the first recess 301f of the substrate 301. In some embodiments, the buried word line 304 is in a configuration similar to the buried word line 304 described above or illustrated in FIG. 4.

In some embodiments, the fuse dielectric 313d undergoes a dielectric breakdown process when a voltage is applied between the fuse gate structure 313 and the buried word line 304. In some embodiments, the fuse dielectric 313d is breakable when a voltage bias between the buried word line 304 and the control bit line 302 is substantially greater than 2V. In some embodiments, the voltage bias is about 2V to about 4V. In some embodiments, the voltage bias is about 5V to about 10V.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor structure, comprising:
    a substrate including a first surface, a first doped region disposed under the first surface, a second doped region disposed under the first surface, and a recess indented into the substrate and disposed between the first doped region and the second doped region;
    a control gate structure disposed over the first doped region and electrically connected to a control bit line;
    a fuse gate structure disposed over the second doped region and electrically connected to a fuse bit line, wherein the fuse gate structure includes a fuse dielectric disposed on and contacted with the second doped region; and
    a buried word line disposed between the control gate structure and the fuse gate structure, wherein the buried word line is disposed within the recess of the substrate.

2. The semiconductor structure of claim 1, wherein the buried word line is disposed under and away from the first surface of the substrate.

3. The semiconductor structure of claim 1, wherein the buried word line is disposed under and away from the first doped region and the second doped region.

4. The semiconductor structure of claim 1, wherein the recess extends from the first surface of substrate towards a second surface of the substrate opposite to the first surface.

5. The semiconductor structure of claim 1, wherein the fuse dielectric and the dielectric layer are breakable when a voltage bias between the buried word line and the fuse bit line is substantially greater than 5V.

6. The semiconductor structure of claim 1, wherein the buried word line is disposed under and away from the fuse dielectric.

7. The semiconductor structure of claim 1, wherein the fuse dielectric includes oxide or metal containing oxide.

8. The semiconductor structure of claim 1, wherein the first doped region and the second doped region are of a same conductivity type.

9. The semiconductor structure of claim 1, wherein the buried word line includes a conductor and a dielectric layer disposed within the recess and between the substrate and the conductor.

10. The semiconductor structure of claim 9, wherein the dielectric layer is disposed conformal to a sidewall of the recess.

11. The semiconductor structure of claim 9, wherein the dielectric layer includes a first portion disposed between the conductor and the substrate, and a second portion disposed under the conductor, and wherein a thickness of the first portion is substantially greater than a thickness of the second portion.

12. The semiconductor structure of claim 9, wherein the dielectric layer includes high-k (high dielectric constant) dielectric material.

13. The semiconductor structure of claim 1, wherein the control bit line and the fuse bit line are substantially orthogonal to the buried word line.

14. The semiconductor structure of claim 1, wherein the control bit line and the fuse bit line are substantially parallel to each other.

* * * * *